(12) United States Patent
Guillon et al.

(10) Patent No.: US 10,854,524 B2
(45) Date of Patent: Dec. 1, 2020

(54) POWER SEMICONDUCTOR MODULE

(71) Applicant: ABB Schweiz AG, Baden (CH)

(72) Inventors: David Guillon, Vorderthal (CH);
Charalampos Papadopoulos, Lenzburg (CH); Dominik Truessel, Bremgarten (CH); Fabian Fischer, Baden (CH); Samuel Hartmann, Staufen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/531,296

(22) Filed: Aug. 5, 2019

(65) Prior Publication Data

US 2019/0363029 A1    Nov. 28, 2019

Related U.S. Application Data

(63) Continuation of application No. PCT/EP2018/052436, filed on Jan. 31, 2018.

(30) Foreign Application Priority Data

Feb. 3, 2017    (EP) ..................................... 17154673

(51) Int. Cl.
*H01L 23/053* (2006.01)
*H01L 23/24* (2006.01)
(Continued)

(52) U.S. Cl.
CPC ............ *H01L 23/053* (2013.01); *H01L 23/24* (2013.01); *H01L 23/3135* (2013.01);
(Continued)

(58) Field of Classification Search
CPC ..................................................... H01L 23/053
See application file for complete search history.

(56) References Cited

U.S. PATENT DOCUMENTS

| 5,194,933 A | 3/1993 | Miyagi |
| 9,418,910 B2 | 8/2016 | Miyamoto et al. |

(Continued)

FOREIGN PATENT DOCUMENTS

| DE | 4133199 A1 | 5/1992 |
| DE | 112012006656 T5 | 3/2015 |
| EP | 1739740 A2 | 3/2007 |

OTHER PUBLICATIONS

European Patent Office, International Search Report & Written Opinion issued in corresponding Application No. PCT/EP2018/052436, dated Apr. 19, 2018, 10 pp.

(Continued)

*Primary Examiner* — Marvin Payen
(74) *Attorney, Agent, or Firm* — Slater Matsil, LLP

(57) ABSTRACT

The present application provides a power semiconductor module, including a support which carries at least one power semiconductor device, the support together with the power semiconductor device is at least partly located in a housing, the support and the power semiconductor device are at least partly covered by a sealing material, additionally to the sealing material, a protecting material is provided in the housing, the protecting material is formed from silicon gel and the protecting material at least partly covers at least one of the support, the power semiconductor device and the sealing material.

20 Claims, 4 Drawing Sheets

(51) Int. Cl.
H01L 23/31 (2006.01)
H01L 23/492 (2006.01)
H01L 23/00 (2006.01)

(52) U.S. Cl.
CPC ............ *H01L 23/492* (2013.01); *H01L 24/48* (2013.01); *H01L 24/72* (2013.01); *H01L 2224/48091* (2013.01); *H01L 2224/48227* (2013.01)

(56) References Cited

U.S. PATENT DOCUMENTS

| | | | |
|---|---|---|---|
| 2010/0127371 A1 | 5/2010 | Tschirbs | |
| 2013/0056883 A1* | 3/2013 | Furukawa | H01L 23/16 257/782 |
| 2013/0161801 A1* | 6/2013 | Otremba | H01L 23/3735 257/668 |

OTHER PUBLICATIONS

European Patent Office, Extended Search Report issued in corresponding Application No. 17154673.2, dated Aug. 17, 2017, 6 pp.

* cited by examiner

POWER SEMICONDUCTOR MODULE

TECHNICAL FIELD

The present invention relates to a power semiconductor module. The present invention especially refers to a power semiconductor module showing a good long-life reliability.

BACKGROUND ART

Power semiconductor modules comprising power semiconductor devices, such as switching power semiconductor devices, are generally known in the art. It may be important for specific applications to protect power semiconductor devices mechanically and/or with regard to environmental factors.

DE 11 2012 006 656 T5 describes a semiconductor device. With this regard, a circuit pattern is bonded to a top surface of a ceramic substrate. A cooling body is bonded to an undersurface of the ceramic substrate. An insulated-gate bipolar transistor (IGBT) and a forward converter (FWD) are provided on the circuit pattern. A coating film covers a junction between the ceramic substrate and the circuit pattern, and a junction between the ceramic substrate and the cooling body. A mould resin seals the ceramic substrate, the circuit pattern, the IGBT, the FWD, the cooling body, and the coating film etc. The ceramic substrate has higher thermal conductivity than the coating film. The coating film has lower hardness than the mould resin and alleviates stress applied from the mould resin to the ceramic substrate. The circuit pattern and the cooling body includes a groove contacting the mould resin without being covered with the coating film.

DE 41 33 199 A1 describes a semiconductor device using an insulation coated metal substrate including semiconductor elements supported on an insulation coated metal substrate which is made of a metal substrate and an insulation layer disposed on the metal substrate, a wiring of a metallic foil formed on the insulation layer and connected to the semiconductor elements, an insulative sealing material covering the semiconductor elements and the wiring, and a solid insulation with a larger specific inductive capacity than that of the sealing material which is interposed between an edge part of the wiring and the sealing material.

US 2013/0161801 A1 describes a module including a discrete device mounted on a DCB substrate and a method of manufacturing thereof. The discrete devices include one or more semiconductor chips. The semiconductor chips or at least parts of the semiconductor chips may be packaged by covering the semiconductor chips with an encapsulation material. It is further described, that a silicone gel is provided which is deposited on the DCB substrate and covers the discrete device.

US 2013/0056883 A1 describes a semiconductor device including a base board, a mounting substrate, a semiconductor element, a holder, a holder terminal, a case, a first sealing layer, and a second sealing layer. The first sealing layer covers the mounting substrate and the semiconductor element inside a space surrounded by the case. The second sealing layer is provided on the first sealing layer inside the space surrounded by the case and has a hardness higher than a hardness of the first sealing layer.

EP 1 739 740 A2 relates to a power semiconductor and, more particularly, to a module structure of a high breakdown voltage semiconductor in which high reliability has been achieved with high capacitance. In detail, it is described that in a power semiconductor, an interface between a semiconductor element and an aluminum wire is coated with a first insulating resin having electrically conductive properties to improve the joint life of the metal wire, making it possible to improve the life of the module. It is further described that a second resin is provided which is provided on top of the first resin.

The solutions of the prior art, however, still give room for improvements, for example regarding providing an effective measure against negative influences acting on the power semiconductor devices and thus regarding the long-life reliability.

DISCLOSURE OF INVENTION

It is an object of the present invention to provide a power semiconductor module which overcomes at least one drawback of the prior art. It is in more detail an object of the present invention to provide a power semiconductor module which shows a high long-life reliability, or long-term reliability, respectively.

These objects are at least partly solved by a power semiconductor module according to independent claim 1. Advantageous embodiments of the present invention are given in the dependent claims, in the further description as well as in the figures, wherein different embodiments can, alone or in any combination, provide a feature of the present invention unless not clearly excluded.

The present invention provides a power semiconductor module, comprising a support which carries at least one power semiconductor device, wherein the support together with the power semiconductor device is at least partly located in a housing, wherein the support and the power semiconductor device are at least partly covered by a sealing material, wherein additionally to the sealing material, a protecting material is provided in the housing, wherein the protecting material is formed from silicon gel and wherein the protecting material at least partly covers at least one of the support, the power semiconductor device and the sealing material, wherein the sealing material comprises a contact area to the protecting material, wherein the sealing material is structured at said contact area, wherein the sealing material is structured at the contact area by a rough area, at least one protrusion or at least one recess.

Such a power semiconductor module provides an effective and long-term reliable protection for the electronic circuit and its power semiconductor device with regard to inner and/or outer mechanical and/or electronical influences. It may thereby be formed easily.

The present invention thus refers to a power semiconductor module. The power semiconductor module comprises a support, wherein it is included in the present invention that one or more supports may be provided. In detail, it may be provided that only one support is provided which carries one or more power semiconductor devices or that more than one supports are provided, wherein each support carries one or more power semiconductor devices. This may allow an easy and adaptable production of the power semiconductor module.

Regarding the power semiconductor devices, it might be provided that a plurality of transistors, or switching devices, respectively, are provided, such as insulated-gate bipolar transistor (IGBT) devices, metal oxide semiconductor field-effect transistors (MosFET), diodes, and/or the like.

The respective one or more power semiconductor devices may be part of one or more electronic circuits like it is known in the art. Therefore, depending on the respective embodiment, the support may comprise a plurality of electrical conductors, such as metallizations, and terminals or connectors, which are used for externally and internally connecting different parts of the power semiconductor module. The terminals or connectors are thereby located on respective positions on the conductors, such as on the metallizations.

The support may for example be a substrate, such as for example a ceramic substrate, or it may be a baseplate, like it will be described in detail down below.

It is further provided that one or more supports together with one or more power semiconductor devices, or chips, respectively, is at least partly located in a housing, wherein the support and the power semiconductor device are at least partly covered by a sealing material. The sealing material may thus cover at least partly the power semiconductor device and the support. This is generally known in the art and may protect the power semiconductor device and the electronic circuit it is part of or at least the covered areas thereof with regard to outer influences and may further improve creepage distances.

According to the power semiconductor module as described above, it is provided that additionally to the sealing material, a protecting material is provided in the housing, wherein the protecting material is formed from silicon gel and wherein the protecting material at least partly covers at least one of the support, the power semiconductor device and the sealing material. This arrangement may provide significant advantages over the prior art as it provides a secure protection of the electronic circuit on substrate level as well as on chip level.

This may be mainly due to the fact that by providing a sealing material, only, the respective parts often cannot be fully protected as it may be difficult to ensure that all desired positions of the support and the power semiconductor device or further parts of the respective electronic circuit are effectively covered by the sealing material. This may for example be relevant in case the sealing material is formed as a mould compound, such as a transfer mould compound, like it is known in the art. This may be caused for example by actual designs of power modules as these only are known to be filled with silicon gel which may simply be poured into a housing without having an essential need of taking measures for ensuring a complete filling of the housing. These actual designs, however, are generally not provided with a sealing material as the design is optimized for pouring and hardening a protection material, i.e. the silicon gel. Therefore, effectively providing a sealing material is often hard without significantly changing the design of the module. Thus, design adaptions may be used for ensuring an effective protection by the sealing material.

A power semiconductor module according to the present invention, however, overcomes this disadvantage as it is no longer detrimental in case the sealing material is not fully provided at the respective positions. The further protecting material, i.e. the silicon gel, will address the problems arising therewith. It may be provided that the housing is fully filled with silicon gel, even though this is not mandatory and according to the specific application it may be sufficient to only partly fill the housing with the protecting material. As a result, the present invention clearly overcomes the problems of the prior art according to which providing a sealing material is not or only hardly possible with the actual power module designs and thus without significant changes in module design.

Therefore, although showing good results with regard to improving creepage distances and/or resistance against outer influences, a sealing material in combination with a protecting material being formed from silicon gel can further improve fulfilling the required safety requirements. The sealing material is different from the protecting material.

In power modules, such as comprising IGBT-devices as power semiconductor devices, humidity stress may be a risk for reliability problems. For subsea applications, for example, the transfer moulding technology for providing a sealing material has shown promising results with respect to humidity resistance. For example when using an Epoxy-Mould Compound (EMC) or epoxy resins as sealing material, good results can be achieved.

Therefore, generally and with regard to the sealing material, it may be provided that the sealing material comprises epoxy moulding compounds and epoxy resins, for example. These materials have superior properties such as high mechanical strength and high productivity and are very effective regarding their electrical properties.

With regard to mechanical properties, it may be provided that the coefficient of thermal expansion (CTE) of the sealing material may lie in a region of $\geq 7$ ppm/k to $\geq 15$ ppm/K. Additionally or alternatively, the young modulus of the sealing material may exemplarily lie in a region of $\geq 7$ GPa to $\leq 15$ GPa.

It may further be provided that the sealing material comprises a filler, such as from an electrically insulating material, wherein the filler content may lie in a range of $\geq 70$ weight-% to $\leq 95$ weight-%, such as of $\geq 80$ weight-% to $\leq 90$ weight-%. By providing a filler in the sealing material, both the mechanical as well as the electrical properties of the sealing material may be adapted and improved. Therefore, best results for the desired need may be reached. Non-limiting examples for the filler of the sealing material comprise silicon dioxide ($SiO_2$).

Even in case the sealing material shows the above advantages, however due to power module packaging design, the creepage and the insulation distance is complex to be covered only by the sealing material like stated above. Therefore combining both silicon gel and a sealing material such as EMC materials shows superior results with regard to a combination of resistance against outer influences and further with regard to creepage and insulation distances.

For example, the transfer moulding process can be realized for applying the sealing material. A material which is applied in such a manner may provide superb mechanical stability as well as electronic insulating properties. However, such materials are often hard to apply with complex structures, so that the combination of a sealing material and a protecting material being formed from silicon gel may be very effective according to this embodiment.

The transfer moulding process may be realized on a stand-alone wafer, a substrate or even once the substrates have been bonded, such as soldered, onto base plate carrier. Openings which may be free of mould compound on the carrier, such as substrate metallization, may be provided for the output electrical connection, or external connectors, respectively, such as collector, emitter and auxiliary terminals. The concerns of cross contamination from terminal bonding techniques are less critical since most of the sensitive regions may already be protected by the sealing material before performing bonding techniques, such as by bonding the emitter, such as at an IGBT. After the terminal bonding, the protecting material can be potted to fully insulate the external terminals.

The power semiconductor module thus allows substrate handling which has not to be strictly in clean room environment due to the presence of the sealing material, which may ease particle prevention of ultrasonic welding process, for example, when terminals are attached after a moulding process with the sealing material.

A further housing arrangement may be provided which seals the external terminals even in case they are separated from the power devices by a housing part, like it will be described down below.

Taking the above, the present invention therefore goes a complete different way compared to todays solutions. In today applications, it is mainly tried to substitute completely the silicone gel to sealing materials wherein the power module packaging is the challenge to keep the internal creepage distance between the main potential collector and emitter/gate. According to the power module as described here, however, the silicon gel is not substituted by a sealing material but both materials are used in a combination showing improved properties.

Such a power semiconductor module can thus be implemented in today's standard power modules and thus shows a superb applicability. Due to the independence of the specific design, the power semiconductor module shows a very high design flexibility which strengthens the applicability.

The combination of a sealing material together with silicon gel further may allow improving the creepage distance in order to allow properties which cannot be reached solely by silicon gel or solely by a sealing material.

For example, at least one termination of at least one power semiconductor device, or chip, respectively, is covered by the sealing material. According to this embodiment, the respective creepage distance of the chip or its connectors may be improved so that the working behaviour of the power semiconductor device may be improved significantly. Apart from that, however, the connection areas of the chips, or power semiconductor devices, respectively, may, depending on the embodiment, be free of the sealing material so that electrically connecting the power semiconductor devices may be simplified. A termination may be understood as such area of the power semiconductor device, which laterally surrounds the electrically active area, through which active area the main current flows. According to this, at the termination, electric fields may be terminated. For example, the termination may comprise the lateral edges of the power semiconductor device.

Next to the termination, however, it is fully contained in the present invention that at least one power semiconductor device, and thus the free areas thereof, respectively, are fully covered by the sealing material. The free areas of the power semiconductor device shall thereby mean these areas, which would, without the sealing material, lie free in the housing. Therefore such areas are meant, which are not covered by connectors or the like.

Therefore, it may be provided that at least one power semiconductor device is fully embedded in the sealing material. It may for example be provided that, e.g. according to this embodiment, said power semiconductor device is at least partly contacted by wire bonds, i.e. at least some connections are realized by wire bonds. For example, the wire bonds may proceed to a further metallization, which metallization carries a terminal plate. According to this embodiment, thus, the power semiconductor device is, for example together with its bonding positions and the bonding wires, fully embedded in the sealing material. According to this embodiment, a protection of the electronic circuit, or its power semiconductor device, for example with regard to outer influences, such as mechanical influences or humidity, for example, may be improved very effectively. Thereby, not only the power semiconductor device as such but as well the connections to the wire bonds may for example embedded in the sealing material. This embodiment gives further reliability as such bonding positions may under circumstances be susceptible for damages or for degradations, so that it may be provided that these positions are secured by the sealing material.

Thus, a life time increase of wire bonds and solder joints done with the sealing material may be realized.

It may further be provided that the support comprises a connection area being free of sealing material, wherein the connection area is designed for receiving a terminal plate. In case a terminal plate and thus a terminal, such as a copper power terminal, is positioned on the connection area, it may correspondingly be provided that a terminal plate is located on the connection area, wherein the terminal plate is spaced from the sealing material. In other words, it may be provided that the sealing material is not in direct contact to a terminal plate, or terminal, respectively. According to this embodiment, the risk of exerting mechanical stress from the terminal, such as formed from copper, or from its lead, such as copper lead, which is seen as part of the terminal, to the sealing material may be avoided. Therefore, the long-term reliability of the power semiconductor module as described may be further improved. Apart from that, the connectivity of the terminal is significant improved as it may be connected comparably easy and without spatial hindrance of the sealing material.

Apart from that, in case the sealing material is applied before connecting the terminal, the latter may be placed on the respective connection area without having any danger of negatively influencing the electrical circuit or at least the parts being embedded in the sealing material. Therefore, the production of the power semiconductor module is further simplified and the long-term reliability is further improved.

The connection are which is free after placing the terminal plate may be embedded in protecting material.

Correspondingly, the printed circuit board (PCB) for distribution of control signals may be embedded in the silicon gel but may have no contact to the sealing material.

It may further be provided that the sealing material is not in direct contact to the housing. According to this embodiment, a thermal stress between the housing and the sealing material, which may come up due to different heat expansion coefficients, may be avoided. This embodiment thus additionally improves the long-term reliability of the power semiconductor module as described.

The areas which are between the sealing material and the housing may be equipped with silicon gel.

It is further provided that the sealing material comprises a contact area to the protecting material, wherein the sealing material is structured at said contact area. The structure is for example located at the side of the sealing material being averted from the power semiconductor device. Therefore, the protecting material is in direct contact with the sealing material, wherein the protecting material contacts the sealing material at least partly at a structured position, or area, respectively.

This embodiment may on the one hand mechanically improve the long-term reliability, as the structures may improve the adhesion of the protecting material, i.e. the silicon gel, at the sealing material. Apart from that, respective creepage distance may be improved, so that the working behaviour of the power semiconductor module according to this embodiment may be further improved.

The contact area may be provided with a rough surface in which the surface area is improved compared to a completely smooth surface. Thus, a rough area according to the present invention may be any surface which is not smooth, or flat, respectively. Apart from that and for example, the contact area may comprise protrusions or projections, respectively, such as rips, which proceed into the inner volume of the housing and thus into the protecting material and for example are aligned in a direction averted from the power semiconductor device. Further, the structures may comprise recesses such as grooves, or the like. With this regard, only one recess and/or only one protrusion may be provided or a plurality of recesses and/or a plurality of protrusions may be provided.

Therefore, it may be provided that the sealing material is structured at the contact area by a rough area, at least one protrusions or at least one recess.

It may further be provided that the power semiconductor device is electrically connected by a press-fit connector, for example at its upper side and thus at the emitter contact. According to this embodiment, electrically connecting the power semiconductor device may be realized easily. Further, placing the sealing material may be very easy. This may be due to the fact that no wire bonds or further connections have to be taken into consideration when applying the sealing material and the protecting material, respectively. In contrast thereto, the press-fit connector may be pressed to the upper side of the power semiconductor device and may thus protect the device. It may then be provided that the sealing material is spaced from the press-fit contact or that it contacts it.

It may further be provided that the support comprises a substrate for example being formed from a ceramic material. Such an embodiment may be advantageous dependent from the respective embodiment. In case of this embodiment, it may be provided that the free areas of the substrate are fully covered by the sealing material. The free areas shall for example mean such areas of the main material of the substrate, such as a ceramic material, which are not covered by a further material or layer, such as by a metallization or a solder or the like. This embodiment may further improve the creepage distance and thus the insulation behavior.

It may further be provided that the housing is structured by a T-shape. In other words, the housing may comprise a protrusion, such as a rib, which proceeds into the inner volume of the housing and is thus in contact to the protecting material, or silicon gel, respectively. This embodiment may improve creepage distances and may thus improve the electronic properties and thus the working behaviour of the power semiconductor module.

With regard to further advantages or features of the power semiconductor module, it is referred to the figures as well as to the description of the figures.

BRIEF DESCRIPTION OF DRAWINGS

These and other aspects of the invention will be apparent from and elucidated with reference to the embodiments described hereinafter.

In the drawings.

DETAILED DESCRIPTION OF THE INVENTION

Figure 1:
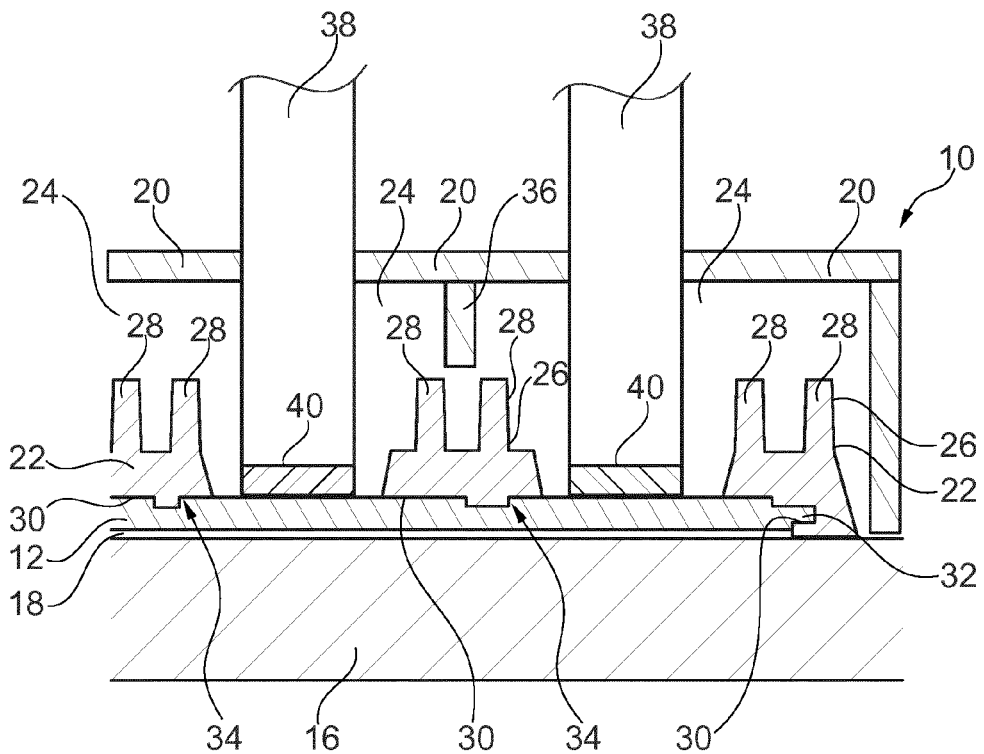
FIG. 1 shows a schematic view onto a part of an embodiment of a power semiconductor module.

Reference will now be made in detail to an exemplary embodiment, which is illustrated in the figures. This example is provided by way of explanation and is not meant as a limitation. It is intended that the present disclosure includes further modifications and variations.

Within the following description of the drawings, the same reference numbers refer to the same components. Generally, only the differences with respect to the individual embodiments are described. When several identical items or parts appear in a figure, not all of the parts have reference numerals in order to simplify the appearance.

FIGS. 1 to 5 show respective embodiments of a power semiconductor module 10.

Figure 2:
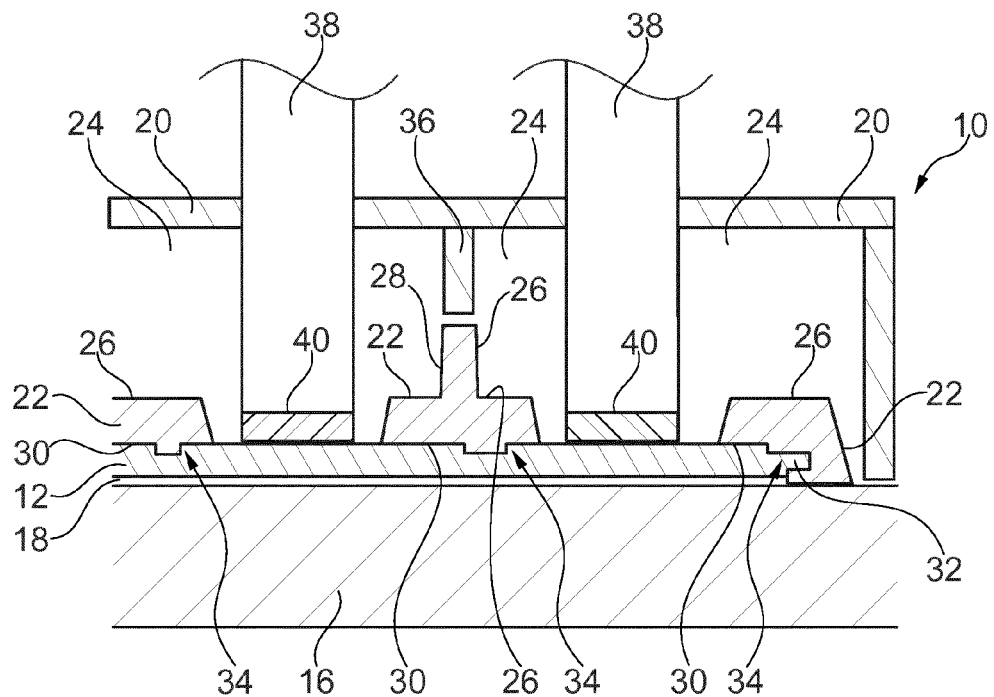
FIG. 2 shows a schematic view onto a part of a further embodiment of a power semiconductor module.

Referring to the embodiment according to FIGS. 1 and 2, the power semiconductor module 10 comprises a support 12 which carries at least one power semiconductor device 14, which is not shown. The support 12, according to FIG. 1, comprises a substrate which may be formed from a ceramic material. The support 12 is located on a baseplate 16 and is attached thereto by a layer of solder 18.

The support 12, together with the power semiconductor device 14, is at least partly located in a housing 20. It is further shown, that the support 12 and the power semiconductor device 14 are at least partly covered by a sealing material 22.

According to FIG. 1, the power semiconductor device 14 is fully embedded in the sealing material 22, for example together with respective wire bonds or comparable connections, so that they cannot be seen.

Further, additionally to the sealing material 22, a protecting material 24 is provided in the housing 20. Whereas the sealing material 22 may be formed from epoxy mould compound, the protecting material 24 is formed from silicon gel. It can further be seen that the protecting material 24 at least partly covers at least one of the support 12, the power semiconductor device 14 and the sealing material 22. The sealing material 22 may for example give a superb protection against humidity.

The figures further show that the sealing material 22 comprises a contact area 26 to the protecting material 24, wherein the sealing material 22 is structured at said contact area 26. In detail, it is shown that the sealing material 22 is structured at the contact area 26 by one or more protrusions 28.

It can further be seen, that the support 12 comprises a contact area 30 to the sealing material 22, wherein the support 12 is structured at said contact area 30. In detail, it is shown that the support 12 comprises protrusions 32 and recesses 34.

Apart from that, the figures show that the housing 20 is formed by a T-shape in that a protrusion 36, such as a rib, is formed which proceeds into the inner volume of the housing 20 and is in contact to the protecting material 24.

It can further be seen, that a terminal 38 is provided, which may be connected to a connecting area 40, which may connect the terminal 38 to the power semiconductor device. The connecting area 40 may be part of a metallization of the support 12, such as of the ceramic substrate.

FIG. 2 shows a comparable embodiment compared to FIG. 1, wherein the left and right sealing material 22 do not contain a protrusion 28 as structure.

Figure 3:
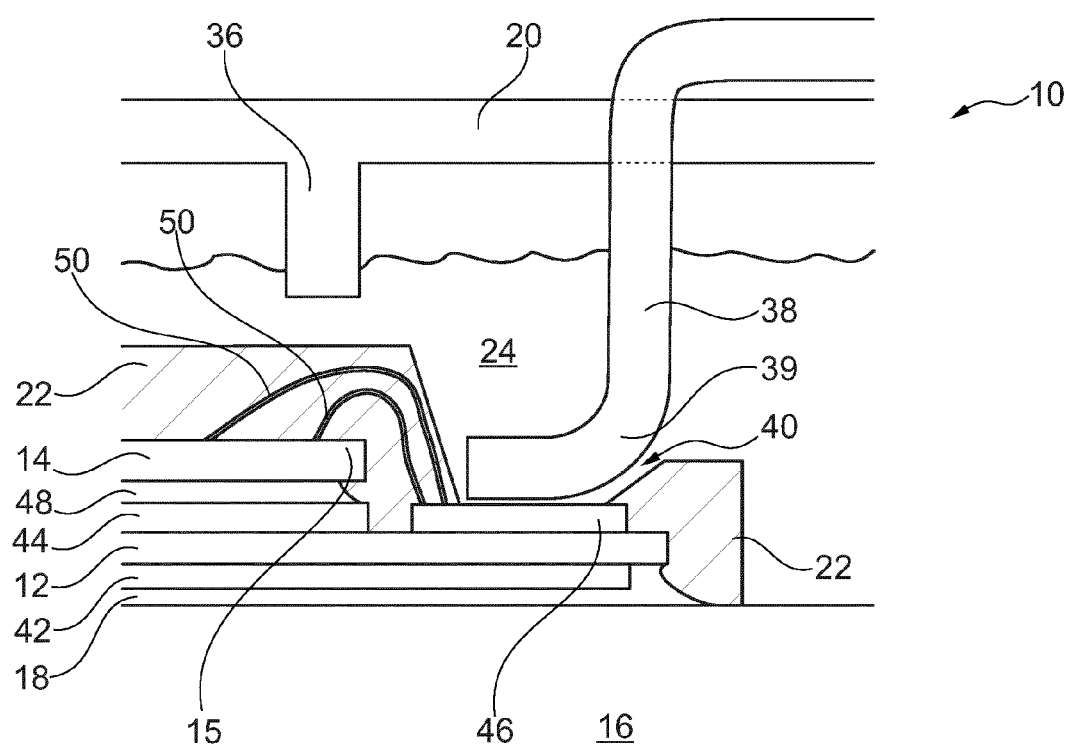
FIG. 3 shows a schematic view onto a part of a further embodiment of a power semiconductor module.
Figure 4:
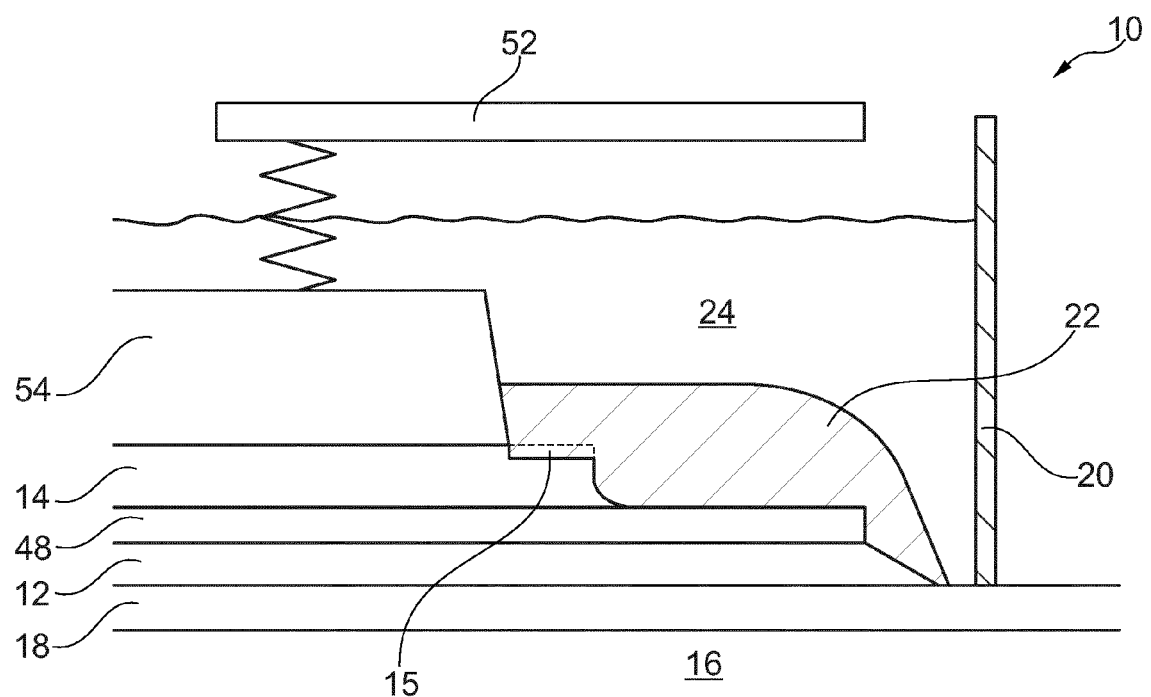
FIG. 4 shows a schematic view onto a part of a further embodiment of a power semiconductor module.
Figure 5:
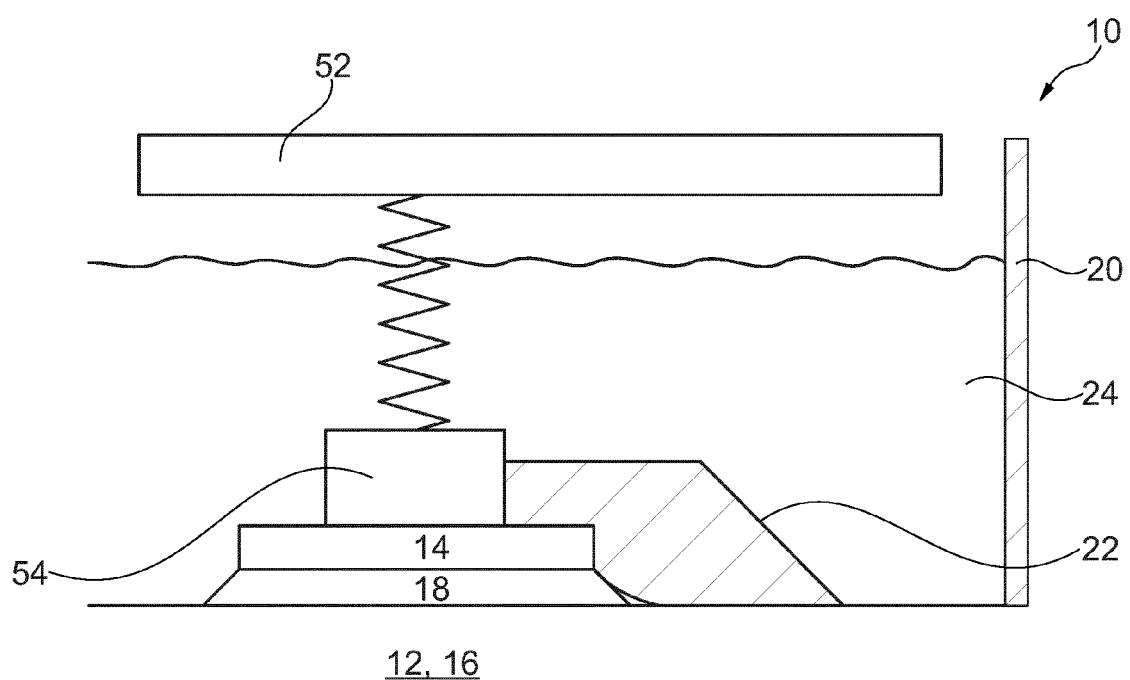
FIG. 5 shows a schematic view onto a part of an embodiment of a power semiconductor module.

FIGS. 3 to 5 show further embodiments of power semiconductor modules 10 in more detail.

FIG. 3 shows a power semiconductor module 10, in which a support 12, formed as a ceramic substrate, is located on a baseplate 16 by means of a solder 18. The support 12, or ceramic substrate, respectively, is provided with a backside metallization 42 between the main layer such as ceramic layer of the support 12 and the solder 18, and different frontside metallizations 44, 46. Regarding the expressions frontside metallizations 44, 46 and backside metallization 42, such expressions are used here to distinguish the two opposite lying electrodes, and are not meant as an absolute position of the electrodes.

The metallization 44 carries via a solder 48 a power semiconductor device 14, or chip, respectively, which is connected via wire bonds 50 to the metallization 46. Further connected to the metallization 46 is a terminal 38 with its terminal plate 39.

It can be seen, that the power semiconductor device 14 together with its termination 15 is fully embedded in the sealing material 22, together with the wire bonds 50, whereas the metallization 46 carries a connecting area 40 being free of sealing material 22 for placing the terminal 38 with its terminal plate 39, or terminal foot, respectively. Thus, the terminal 38 and the terminal plate 39 are spaced to the sealing material 22 and thus not in contact thereto.

FIG. 4 shows a power semiconductor module 10, in which a support 12, formed as a ceramic substrate, is located on a baseplate 16 by means of a solder 18. The support 12 carries via a solder 48 a power semiconductor device 14, or chip, respectively. The power semiconductor device 14 is contacted by a press-fit contact 54 for forming a press-fit connection. The press-fit contact 54 is connected to an emitter plate 52. It can further be seen, that a sealing material 22 is provided, which covers the termination 15 of the chip, or power semiconductor device 14, respectively, and the free areas of the support 12 which is formed as ceramic substrate.

FIG. 5 shows a power semiconductor module 10, in which a support 12 is formed as a baseplate 16. Located on the support 12 is a power semiconductor device 14, or chip, respectively, which is fixed by a solder 18. Again, the power semiconductor device 14 is contacted by a press-fit contact 54 for forming a press-fit connection. The press-fit contact 54 is connected to an emitter plate 52. It can further be seen, that a sealing material 22 is provided, which covers the termination 15 of the chip, or power semiconductor device 14, respectively.

It has to be noted that correspondingly to the right side, a sealing material may be provided at the left side of the press-fit contact 54.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

REFERENCE SIGNS LIST 10 power semiconductor module
12 support
14 power semiconductor device
15 termination
16 base plate
18 solder
20 housing
22 sealing material
24 protecting material
26 contact area
28 protrusion
30 contact area
32 protrusion
34 recess
36 protrusion
38 terminal
39 terminal plate
40 connecting area
42 metallization
44 metallization
46 metallization
48 solder
50 wire bond
52 emitter plate
54 press-fit contact

The invention claimed is:

1. A power semiconductor module, comprising
a support which carries at least one power semiconductor device, wherein
the support together with the power semiconductor device is at least partly located in a housing, wherein
the support and the power semiconductor device are at least partly covered by a sealing material, wherein
additionally to the sealing material, a protecting material is provided in the housing, wherein
the protecting material is formed from silicon gel and wherein
the protecting material at least partly covers at least one of the support, the power semiconductor device and the sealing material, wherein
the sealing material comprises a contact area to the protecting material, wherein said contact area comprises protrusions and/or recesses proceeding into the protecting material.

2. The power semiconductor module according to claim 1, wherein at least a termination of at least one power semiconductor device is covered by the sealing material.

3. The power semiconductor module according to claim 2 wherein the free areas of at least one power semiconductor device are fully covered by the sealing material.

4. The power semiconductor module according to claim 1, wherein at least one power semiconductor device is electrically contacted by wire bonds, wherein the wire bonds are fully covered by the sealing material.

5. The power semiconductor module according to claim 1, wherein the support comprises a connection area being free of sealing material, wherein the connecting area is designed for receiving a terminal plate.

6. The power semiconductor module according to claim 5, which further includes a terminal plate located on the connection area, wherein the terminal plate is spaced from the sealing material.

7. The power semiconductor module according to claim 1, wherein the power semiconductor device is electrically connected by a press-fit connector.

8. The power semiconductor module according to claim 1, wherein the support comprises a substrate.

9. The power semiconductor module according to claim 8, wherein the free areas of the substrate are fully covered by the sealing material.

10. The power semiconductor module according to claim 1, wherein the sealing material is not in direct contact to the housing.

11. The power semiconductor module according to claim 1, wherein the housing is formed T-shaped such, that a protrusion proceeds into the inner volume of the housing and is in contact to the protecting material.

12. The power semiconductor module according to claim 1, wherein the sealing material is formed from an epoxy mould compound or an epoxy resin.

13. The power semiconductor module according to claim 1, wherein the sealing material comprises a filler.

14. The power semiconductor module according to claim 2, wherein at least one power semiconductor device is electrically contacted by wire bonds, wherein the wire bonds are fully covered by the sealing material.

15. The power semiconductor module according to claim 3, wherein at least one power semiconductor device is electrically contacted by wire bonds, wherein the wire bonds are fully covered by the sealing material.

16. The power semiconductor module according to claim 2, wherein the support comprises a connection area being free of sealing material, wherein the connecting area is designed for receiving a terminal plate.

17. The power semiconductor module according to claim 3, wherein the support comprises a connection area being free of sealing material, wherein the connecting area is designed for receiving a terminal plate.

18. The power semiconductor module according to claim 4, wherein the support comprises a connection area being free of sealing material, wherein the connecting area is designed for receiving a terminal plate.

19. The power semiconductor module according to claim 17, which further includes a terminal plate located on the connection area, wherein the terminal plate is spaced from the sealing material.

20. The power semiconductor module according to claim 18, which further includes a terminal plate located on the connection area, wherein the terminal plate is spaced from the sealing material.

* * * * *